United States Patent
Paton

(10) Patent No.: US 6,966,235 B1
(45) Date of Patent: Nov. 22, 2005

(54) REMOTE MONITORING OF CRITICAL PARAMETERS FOR CALIBRATION OF MANUFACTURING EQUIPMENT AND FACILITIES

(76) Inventor: Eric N. Paton, 498 Rio Grande Ct., Morgan Hill, CA (US) 95037

(*) Notice: Subject to any disclaimer, the term of this patent is extended or adjusted under 35 U.S.C. 154(b) by 185 days.

(21) Appl. No.: 09/680,286

(22) Filed: Oct. 6, 2000

(51) Int. Cl.[7] ............................................. H01L 21/66

(52) U.S. Cl. ..................... 73/865.9; 29/407.05; 29/705

(58) Field of Search ............................ 73/865.8–865.9, 73/866; 29/407.05, 407.08, 705; 438/14, 438/16, 18–19

(56) References Cited

U.S. PATENT DOCUMENTS

| | | | | |
|---|---|---|---|---|
| 4,956,538 A | * | 9/1990 | Moslehi | 219/121.6 |
| 5,015,951 A | * | 5/1991 | Melcher | 324/232 |
| 5,270,222 A | * | 12/1993 | Moslehi | 438/7 |
| 5,526,285 A | * | 6/1996 | Campo et al. | 356/405 X |
| 5,660,472 A | * | 8/1997 | Peuse et al. | 374/128 |
| 5,967,661 A | * | 10/1999 | Renken et al. | 374/126 |
| 2002/0073386 A1 | * | 6/2002 | Seidel et al. | 438/14 X |

* cited by examiner

Primary Examiner—Thomas P. Noland

(57) ABSTRACT

Monitoring of parameters using remote sensors, which are attached directly to the product material, allows for non-intrusive entry into the manufacturing area, via the same robotic handling or automated systems used to transport the standard product material. Data is recorded from the sensors, by wireless transmission, or when a signal is impassible, on-board memory will store the data for later downloading.

1 Claim, 4 Drawing Sheets

REMOTE MONITORING OF CRITICAL PARAMETERS FOR CALIBRATION OF MANUFACTURING EQUIPMENT AND FACILITIES

CROSS REFERENCES TO RELATED APPLICATIONS

| U.S. PATENT DOCUMENTS | | | |
| --- | --- | --- | --- |
| 5,660,472 | August 1997 | Peuse et al. | 359,302 |
| 5,967,661 | October 1999 | Renken et al. | 08/867,103 |

TECHNICAL FIELD

The present invention relates to a device and method of remotely monitoring critical parameters for calibration of manufacturing equipment and facilities. The present invention has particular applicability in remotely monitoring and recording critical parameters wherein the use of wires between the measuring device, and the recording device, are difficult or near impossible.

BACKGROUND ART

Quantitative parameters in an environment such as temperature, humidity, pH, viscosity, velocity, density, distance, acceleration, liquid and gas flow, chemical composition, gas analysis, electrolyte analysis, vibration frequency, strain, pressure, radiation, and particle counts are a few of the critical gauges in characterizing any environment. These parameters influence dynamic and static mechanical, physical, electrical, chemical, and diffusive properties of the environment.

Occasionally, these parameters must be monitored or calibrated to authenticate the stability or state of the environment. In particular, this disclosure addresses the environment used for various industries such as farming, mining, construction, non-electrical machinery, transportation equipment (including automobiles), food products, chemicals (including petrochemicals), electrical and electronic equipment, textiles, utilities, and the natural environment in which we live.

Applications to Process Control and Monitoring with Factory Automation

Industrial technology has increasingly become capital intensive, and has displaced both skilled and unskilled workers. The term automation, coined from the words automatic and operation, describes all such processes in which mechanical and/or electronic devices are employed to carry out tasks without human intervention.

Currently, and into the future, manufacturing assembly lines will involve less human intervention through the use of factory automation and robotics. One example of an industry that has incorporated a high level of factory automation is integrated circuits (IC), flat panel displays, microelectromechanical devices (MEMs) and other electrical materials. Other industries with an increasing focus on automation include farming, mining, construction, non-electrical machinery, transportation equipment (including automobiles), food products, chemicals, electrical and electronic equipment, and clothing.

The demands on manufacturing continue to increase, in order to foster continuous improvements in efficiency, throughput, cost reduction, performance, and stability. This allows companies to maintain profitability in a highly competitive market.

Manufacturing process stability requires stable equipment. The objective is for every tool to perform like every other such tool, with no unique signatures. An appropriate combination of well engineered tools and appropriate metrology is necessary to maximize productivity while maintaining acceptable cost of ownership.

To minimize this variation, state-of-the-art manufacturing equipment come installed with permanently attached electronic sensors. These sensors are positioned in close proximity to the area of interest, and linked to computers that monitor any variation in the data, and are trigged by alarms if established tolerances are exceeded.

Similar to other quantitative measuring devices, this data is not accurate unless the sensor is calibrated to a known standard. Otherwise, the measurement can not be universally compared with other sensors measuring the same parameter. To calibrate the permanently installed sensors, another temporary sensor, that measures the same parameter, is routinely used. This temporary sensor may either be previously calibrated to National Institute of Standards and Technology (N.I.S.T.) to provide absolute measurement values, or it is an "internal" standard, to baseline the parameter against other systems in the same manufacturing facility, corporation, or institution.

Measurement Parameters of Interest

Quantitative parameters in an environment such as temperature, humidity, pH, viscosity, velocity, density, distance, acceleration, liquid, plasma, and solids analysis, vibration frequency, stress/strain, pressure, radiation, and particle counts are a few of the critical gauges in characterizing any environment.

Temperature

One of the most important and commonly measured parameters is temperature. The word "capital goods" will be used in this context to address the manufactured solid, liquid, or gas of interest. Capital goods temperature, is a very influential parameter in controlling the physical properties, and reaction kinetics during process manufacturing. As such, control of temperature and uniformity of temperature, is a key parameter for achieving process control. Common techniques include sensors such as thermocouples, platinum resistors and silicon diodes, which are immersed in the environment of the capital goods.

Other methods of temperature measurement included radiation thermometry or pyrometry. Radiation pyrometry involves measuring long wavelength radiation from an object and making a temperature determination on the basis of that measurement. Radiation pyrometry has several disadvantages. Among these disadvantages is the reliance on a surface optical emissive properties which vary with temperature, and surface/subsurface physical properties. Another non-contact method for measuring surface temperature is with a fluroptic sensor. This technique uses a laser probe, which records the temperature dependent decay rate of a phosphor coating on the capital goods surface.

Flow rate

Common methods for measuring flow rate include "paddle wheel" and hinged vane type transducers. For lower flow rate and when size and weight limitations are considered, higher accuracy can be obtained using thermally based anemometers and liquid flow meters. This technique measures the differential temperature between two sensors, or alternatively, measures the energy required to maintain a heated resistance wire at constant temperature.

Distance

Common methods for measuring distance include ultrasonics, radar, and linear variable differential transformers.

Particles

Many of our modern, high technology industrial practices demand cleanliness. Specifically, they demand an absence of particle contamination. For example, microelectronic and micromechanical devices demand cleanliness since particles as small as 50 nm may cause a degradation in the product yield. Another example may be drawn from the pharmaceutical industry: A parenteral (injectible) drug must be free of particles that could block a blood vessel, causing a stroke (interruption of blood supply to part of the brain) or necrosis (interruption of blood supply to a tissue). The drug maker, as well as the microelectronic/micromechanical maker, has to manage the production environment to eliminate particle contamination.

The basic methods of particle detection employ HeNe lasers, laser diodes, photodiodes, and support equipment. Particles are introduced through inlet jets when monitoring aerosol or gas media, or through capillaries when monitoring liquid media. Laser power illuminates the particles in the sample cavity. The particles produce a pulse of light that is detected by a photodiode. The photodiode converts the pulse to an electrical signal (converts current to voltage), amplifies the voltage, and compares the pulse voltage to a set of thresholds. If a particle exceeds one threshold but not the next greater threshold, the instrument places the particle into the lower threshold. The threshold value corresponds to the size of the particles, and the frequency of scattering events corresponds to the quantity of particles in the sample volume.

Humidity

Relative humidity is a difficult physical parameter to transduce, and most transducers available require complex signal conditioning circuitry. Common methods include measuring the change in resistance or capacitance of a sensor in contact with the environment.

Pressure

Common methods for measuring pressure include: a) barometers (capacitive, bonded strain gauge and semiconductor transducers), b) manometers (difference in height h of two mercury columns, one open to the atmosphere and the other connected to a source of known pressure), c) Bourdon tubes (a tube that straightens out when the internal pressure exceeds the external pressure, d) Aneroid (thin flexible ends of an evacuated chamber that are pushed in or out by an external pressure) and d) ion gauges.

Viscosity

The viscosity of a fluid is given a quantitative definition in terms of an experiment in which a plate of area A is pulled across a layer of fluid s thick. For most fluids, it is found that the force F required to pull the plate at a constant speed v, is proportional to A and v, and inversely proportional to s.

$$N=F*s/A*v$$

Radiation

Unstable atomic nuclei emit three kinds of radiation:
Alpha particles
Beta particles
Gamma particles A magnetic field is used to quantify each of these particles. With a magnetic field directed into the page, the positively charged alpha particles are deflected to the left, and the negatively charged beta particles are deflected to the right. Gamma rays carry no charge and are not affected by the magnetic field.

Other More Advanced Chemical/Material Analysis Techniques

Many techniques exist for characterizing liquids, gases, plasmas and solids. These include, but are not limited to:
electron beam instruments
  1. Energy dispersive x-ray spectroscopy (EDS)
  2. Cathodoluminescence (CL)
x-ray/electron diffraction and scattering
electron/x-ray emission spectroscopy
  1. x-ray photoelectron spectroscopy (XPS)
  2. Ultraviolet Photoelectron Spectroscopy (UPS)
  3. Auger Electron Spectroscopy (AES)
  4. Reflection High Energy Electron Diffraction (REELS)
  5. X-ray Fluorescence (XRF)
visible/UV emission, reflection and absorption
  1. Photoluminescence (PL)
  2. Modulation Spectroscopy
  3. Variable Angle Spectroscopic Ellipsometry (VASE)
Vibrational Spectroscopy
  1. Fourier Transform Infrared Spectroscopy (FTIR)
  2. Raman Spectroscopy
  3. Solid State Nuclear Magnetic Resonance (NMR)
Ion Scattering
  1. Rutherford Backscattering Spectroscopy (RBS)
  2. Elastic Recoil Spectroscopy (ERS)
  3. Ion Scattering Spectroscopy (ISS)
Mass/Optical spectroscopy
  1. Residual Gas Analyzer (RGA)
  2. Dynamic/Static Secondary Ion Mass Spectroscopy
  3. Laser Ionization Mass Spectroscopy (LIMS)
  4. Sputtered Neutral Mass Spectroscopy (SNMS)
  5. Glow Discharge Mass Spectroscopy (GDMS)
  6. Inductively Coupled Plasma Mass Spectroscopy
  7. Inductively Coupled Plasma/Optical Emission Spectroscopy
Neutron/Nuclear Spectroscopy
  1. Neutron Diffraction
  2. Neutron Reflectivity
  3. Neutron Activation Analysis (NAA)
  4. Nuclear Reaction Analysis (NRA)

Details on these measurement techniques can be found in ref. [3, Encyclopedia of Materials Characterization, C. R Brundle, C. A. Evans, S. Wilson, C 1992, Reed Publishing, pp 1–750.]

Measurement Accessibility

In high volume mass production, capital goods are manufactured rapidly through machines or tools using fully automatic robotic handling. In many instances, the environment within the machine or tool may be inaccessible to place a measurement probe at the point of interest. For example, robotic handling equipment may be used to transfer the capital goods through small openings and air locks, and into a series of vacuum chambers, or into chemical tanks, furnaces, hot plates, plumbing, or light exposure stages. In addition, capital goods are introduced into hostile environments such as extreme temperatures, poisonous gases, low pressure (i.e. vacuum), acid or basic solutions, or radiation.

The aforementioned factors inhibit the ability for fast and non-intrusive capital goods measurement. More specifically, the manufacturing equipment may stop regular production for an extended period of time. In many instances, the system must be purged of all inhospitable environments, then dismantled to allow manual placement of the measurement device into the process area of interest. Next, the system must be returned to the standard process conditions before any measurements can be made. After the measurement is complete, the system must be purged again of all inhospitable environments, and the calibration device is removed. Finally, the system is returned to the standard process conditions before the equipment is returned for normal processing. This extended downtime is costly and laborious.

SUMMARY OF THE INVENTION

The present invention is an apparatus for measuring critical parameters used in manufacturing of semiconductor substrate in microelectronic processing without evasive interruptions to manufacturing equipment. In preferred embodiments the critical parameters are selected from the group consisting of temperature, liquid and gas flow rate, distance, particles, humidity, pressure, viscosity, radiation, velocity, density, acceleration, stress/strain, pH, Energy Dispersive X-ray Spectroscopy (EDS), Cathodoluminescence (CL), X-ray Photoelectron Spectroscopy (XPS), Ultraviolet Photoelectron Spectroscopy (UPS), Auger, Electron Spectroscopy (AES), Reflection High Energy Electron Diffraction (REELS), X-ray Fluorescence (XRF), Photoluminescence (PL), Modulation Spectroscopy, Variable Angle Spectroscopic Ellipsometry (VASE), Fourier Transform Infrared Spectroscopy (FTIR), Raman Spectroscopy, Solid State Nuclear Magnetic Resonance (NMR), Rutherford Backscattering Spectroscopy (RBS), Elastic Recoil Spectroscopy (ERS), Ion Scattering Spectroscopy (ISS), Residual Gas Analyzer (RGA), Dynamic/Static Secondary Ion Mass Spectroscopy, Laser Ionization Mass Spectroscopy (LIMS), Sputtered Neutral Mass Spectroscopy (SNMS), Glow Discharge Mass Spectroscopy (GDMS), Inductively Coupled Plasma Mass Spectroscopy, Inductively Coupled Plasma Optical Emission Spectroscopy, Neutron Diffraction, Neutron Reflectivity, Neutron Activation Analysis (NAA), Nuclear Reaction Analysis (NRA) and combinations thereof. In a preferred embodiment, the apparatus comprises one or more sensors, the one or more sensors attached to surfaces on the semiconductor substrate for collecting data therefrom. The invention also comprises an electronic device for processing data collected from the one or more sensors, and an energy source for the electronic device, wherein said sensors and electronic device reside completely on the surface of the semiconductor substrate. In a preferred embodiment, the electronic device comprises one or more of the following: an analog to digital converter, a signal conditioning device and a data recording device. A preferred embodiment further comprises an external wireless receiving module wherein the collected data is transmitted digitally in real-time from the electronic device to the external wireless receiving module, and wherein the data can be further utilized as desired. In a preferred embodiment, the electronic device further comprises a solid state memory device wherein the collected data is stored locally on the solid state memory device such that the data can later be downloaded and utilized. Optionally, the solid state memory is selected from the group consisting of Electrically Erasable Read Only Memory (EEPROM), Ferroelectric Random Access Memory (FeRAM), Magnetic Bubble Memory, Flash, Dynamic Random Access Memory, Static Random Access Memory, First In/First Out (FIFO) and Giant MagnetoResistive Random Access Memory (GMRRAM). In a preferred embodiment, the energy source comprises a battery functional at elevated temperatures up to 150° C. Optionally, the battery is selected from the group consisting of lithium metal, lithium ion, and Nickel Metal Hydride NiH) batteries. A preferred embodiment further comprises an insulation to isolate the material to protect the electronic device from hostile manufacturing or processing environments. Optionally, the isolation material is selected from the group consisting of material with low thermal conductivity, material with low emmisivity, and material with low convectivity. Optionally, the isolation material is selected from the group consisting of silica aerogel, carbon aerogel, silica whiskers, vermiculite, stabilized zirconia, clay, and combinations thereof. Optionally, the isolation material is a material with a high resistance to chemical attack or a material with low permeability. In a preferred embodiment, the one or more sensors, electrical device and energy source operate in a vacuum. In a preferred embodiment, any one of the one or more sensors, electrical device and energy source are hermetically sealed, such that the apparatus is particularly adapted to operation in a vacuum environment. In a preferred embodiment, the one or more sensors, electrical device and energy source are radiation hard, for operation of the apparatus in environments containing radioactive substance. Optionally, the isolation material isolates the one or more sensors, electrical device, and energy source from environmental radiation during operation of the apparatus in an environment containing radioactive substance.

An advantage of the present invention is a device that measures any one or more of the parameters such as temperature, liquid and gas flow rate, distance, particles, humidity, pressure, viscosity, radiation, velocity, density, acceleration, stress/strain, pH and more advanced chemical/material analysis techniques as described in the prior art, in such a way that the sensor if free from wires connecting it to the recorder.

The present invention has particular applicability in monitoring the aforementioned parameters on semiconductor substrates in microelectronic processing. The present invention has the advantage of monitoring these parameters on the semiconductor substrate remotely, without the need for wires extending from the semiconductor substrate surface.

Additional advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other advantages are achieved in part by a sensor or sensors attached to the surface, subsurface, or surrounding environment of the semiconductor substrate and a wire attached from the sensor, to another device attached to the semiconductor substrate adjacent to the sensor. This device records the data internal to the device for later downloading, or immediate transmitting of this data to a location remote to the semiconductor substrate and measurement device. This measurement device has particular advantage since it resides completely on the semiconductor substrate, giving the semiconductor substrate freedom from wires that otherwise must be attached to a recording device external to the environment of interest. This added benefit allows for non-intrusive installation of the measurement device via the same robotic or automated handling or transport systems using to move the ordinary semiconductor substrate.

Additional advantages of the present invention will become readily apparent to those having ordinary skill in the art from the following detailed description, wherein the embodiments of the present invention are described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

The various features and advantages of the present invention will become more apparent as a detailed description of the embodiments thereof is given with reference to the appended figure described below.

DESCRIPTION OF THE INVENTION

Figure 1:
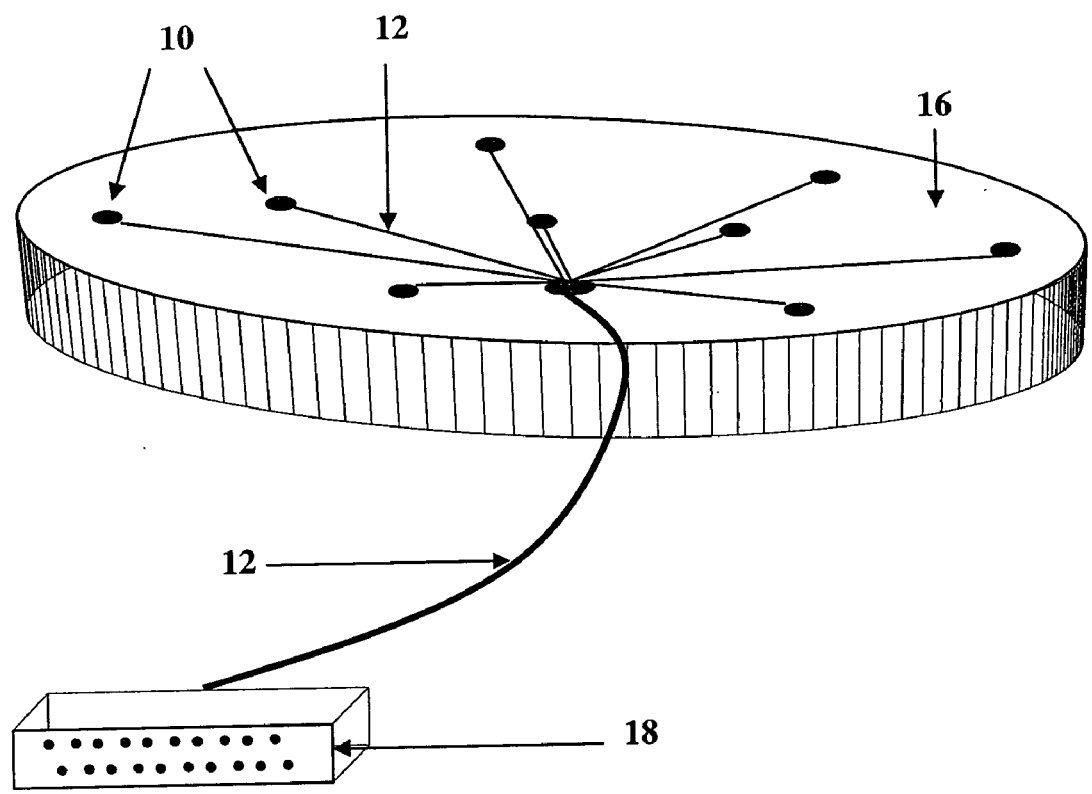
FIG. 1 schematically illustrates sensors mounted on capital goods of the prior art.
Figure 2:
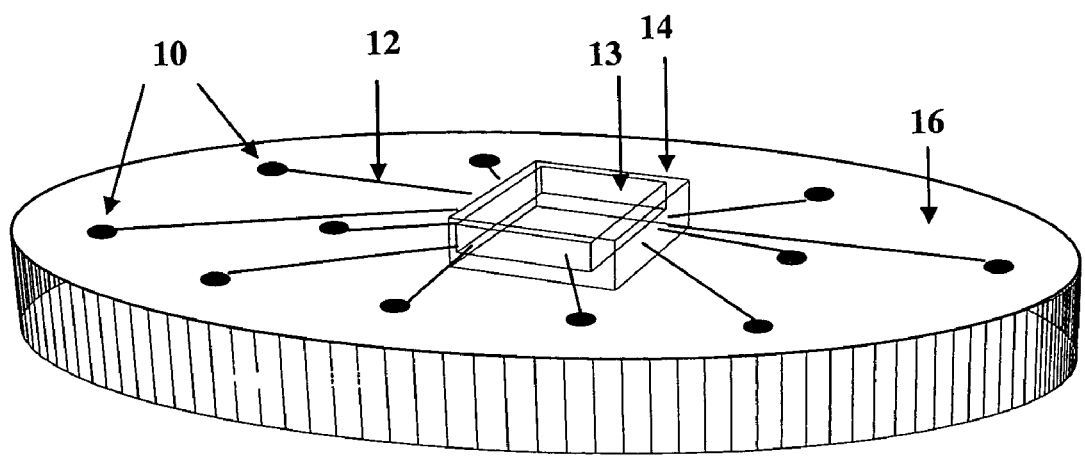
FIG. 2 schematically illustrates the sensors and device of the present invention.
Figure 3:
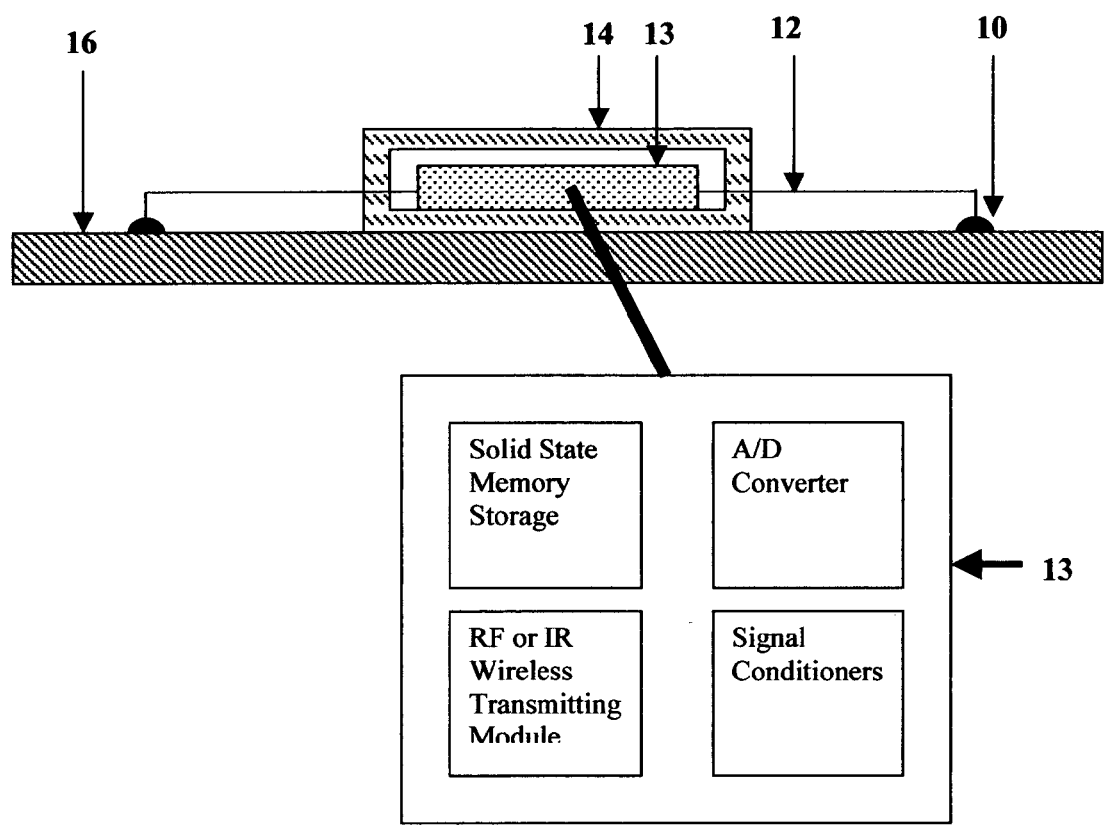
FIG. 3 is a cross-section view of the present invention.

The present invention addresses and solves the problem of measuring process parameters on the surface, sub-surface, or surrounding environment of manufactured semiconductor substrates used in the microelectronics industry.

These semiconductor substrates are measured without the requirement for external connections away from the semiconductor substrate surface or environment, for recording the process data.

In accordance with the present invention, the calibration or measurement device comprises one or more sensors 12, placed on or near semiconductor substrate 16, connected by wire 10, to an electronic device 14. This electronic device comprises one or more analog-to-digital converters. The digital data can be recorded and saved as a function of time, using one of two options:

1) The digital data can be stored as solid state memory, and reside on the semiconductor substrate. Later, after the recording is complete when the semiconductor substrate and measurement device are accessible, the data can be downloaded and saved on a computer or other storage device 24.

2) The digital data can be transmitted 26 instantaneously using a wireless transmitting module, and recorded using a wireless receiving module 22 and saved on a computer or other storage device 24.

Instantaneous monitoring such as that described in Option 2 is preferred since it allows for real-time data collection. In some applications, wireless transmission is not feasible due to impassible boundaries or materials separating the transmitter and receiver. In these instances, Option 1 is necessary, where the data is later downloaded for observation.

In an embodiment of the present invention, when the environmental substance to be measured is temperature, the electronic device 13 must remain isolated from the surrounding heat and/or other hostile environments. To prevent heat transfer to the device 13, a thermally insulating material 14 resides between the heat source, and the device 13. In most applications, the only source of heat resides on a heater below the semiconductor substrate. For applications in which the heat source resides above, or when the device is immersed in the hostile environment, thermal insulation must be provided on all sides of the device. Materials with low thermal conductivities, yet can withstand high temperatures, include, but are not limited to, vermiculite, silica or carbon aerogels, zirconia, stabilized zirconia, and alumina.

Power is provided to the electronic device 13 by a lightweight, compact, and heat resistant battery 20. Lithium and lithium ion batteries meet these requirements, providing high temperature storage capacity up to 500 hours at 150C without any significant voltage discharge.

Figure 4:
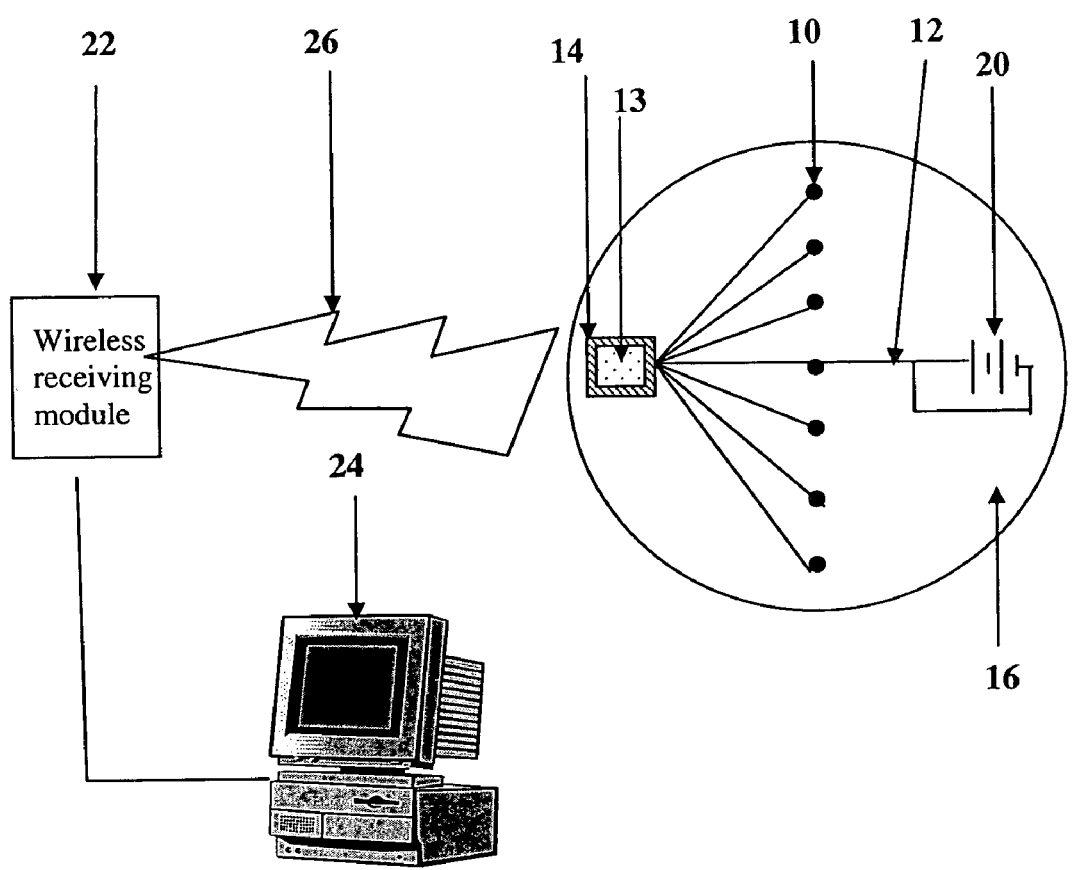
FIG. 4 schematically illustrates the sensors and device of the present invention.

In an embodiment of the present invention, when the environmental substance to be measured is temperature, the result must not be influenced by conduction along the leads and the sensors. Additionally, the electronic device 13 and battery 20 must reside sufficiently away from the sensors, such that the electronics and battery do not act as a heat reservoir. FIG. 4 shows an example of how the sensors 10, electronic device 13, and battery 20 are positioned to provide maximum separation, and the sensors 10 provide uniformity data across the diameter of the semiconductor substrate 16.

An advantage of the present invention, as stated in the earlier embodiment, is the non-intrusive handling and positioning of the semiconductor substrate measuring device, by the same robotics or automated transport used to handle the standard semiconductor substrate material for manufacturing. Several physical requirements of the measurement device must be met to allow for the robotics to operate without fault in the handling. These physical requirements are mass, balance and dimension. For most robotic systems, the added mass of the battery 20, electronics 13, and sensors 10 should not exceed three times (3×) the weight of the semiconductor substrate by itself. Secondly, position of the electronic device 13, battery 20, and sensors 10 must also be mass balanced across the semiconductor substrate 16. FIG. 4 provides an example of how the battery 20 with mass $m_b$, counter-balances the electronic device 13 with mass $m_e$, where $m_b=m_e$. Finally, dimensional constraints exist such that the semiconductor substrate with the measurement device attached, is similar to, or only slightly larger than the standard semiconductor substrate dimensions. As the semiconductor substrate passes between various environments, a minimum clearance must exist to allow for a large enough safety margin for robotic handling inaccuracies, or for other transfer mechanism space limitations.

What is claimed is:

1. An apparatus for measuring parameters used in manufacturing an integrated circuit or a micromechanical device in microelectronic processing without evasive interruptions to manufacturing equipment, the parameters selected from the group consisting of temperature, liquid and gas flow rate, distance, particles, humidity, pressure, viscosity, radiation, velocity, density, acceleration, stress/strain, pH, and the parameters determined using techniques selected from the group consisting of Energy Dispersive x-ray Spectroscopy (EDS), Cathodoluminescence (CL), X-ray Photoelectron Spectroscopy (XPS), Ultraviolet Photoelectron Spectroscopy (UPS), Auger, Electron Spectroscopy (AES), Reflection High Energy Electron Diffraction (REELS), X-ray Fluorescence (XRF), Photoluminescence (PL), Modulation Spectroscopy, Variable Angle Spectroscopic Ellipsometry (VASE), Fourier Transform Infrared Spectroscopy (FTIR), Raman Spectroscopy, Solid State Nuclear Magnetic Resonance (NMR), Rutherford Backscattering Spectroscopy (RBS), Elastic Recoil Spectroscopy (ERS), Ion Scattering Spectroscopy (ISS), Residual Gas Analyzer (RGA), Dynamic/Static Secondary Ion Mass Spectroscopy, Laser Ionization Mass Spectroscopy (LIMS), Sputtered Neutral Mass Spectroscopy (SNMS), Glow Discharge Mass Spectroscopy (GDMS), Inductively Coupled Plasma Mass Spectroscopy, Inductively Coupled Plasma Optical Emission Spectroscopy, Neutron Diffraction, Neutron Reflectivity, Neutron Activation Analysis (NAA), Nuclear Reaction Analysis (NRA) and combinations thereof, the apparatus comprising:

- one or more sensors, the one or more sensors attached to a surface on the integrated circuit or micromechanical device for collecting data therefrom;
- an electronic device for processing data collected from the one or more sensors;
- and an energy source for the electronic device, wherein said sensors and electronic device reside completely on the surface of the integrated circuit or micromechanical device;
- wherein the energy source is a battery functional at temperatures up to 150° C.;
- wherein the electronic device comprises an analog to digital converter, a signal conditioning device, and a solid state memory device for collecting data;
- the apparatus further comprising an external wireless receiving module wherein the collected data is transmitted digitally in real-time from the electronic device to the external wireless receiving module;
- the apparatus further comprising an isolation material to protect the electronic device from hostile manufacturing or processing environments;
- and wherein the one or more sensors, the electronic device components and the battery are radiation hard.

* * * * *